(12) United States Patent
Ock et al.

(10) Patent No.: US 11,841,389 B2
(45) Date of Patent: Dec. 12, 2023

(54) APPARATUS FOR ESTIMATING INSULATION RESISTANCE AND BATTERY SYSTEM USING THE SAME

(71) Applicant: LG Energy Solution, Ltd., Seoul (KR)

(72) Inventors: Jangsoo Ock, Daejeon (KR); Jae Wook Yu, Daejeon (KR)

(73) Assignee: LG Energy Solution, Ltd.

( * ) Notice: Subject to any disclaimer, the term of this patent is extended or adjusted under 35 U.S.C. 154(b) by 137 days.

(21) Appl. No.: 17/439,019

(22) PCT Filed: Sep. 25, 2020

(86) PCT No.: PCT/KR2020/013068
§ 371 (c)(1),
(2) Date: Sep. 14, 2021

(87) PCT Pub. No.: WO2021/101059
PCT Pub. Date: May 27, 2021

(65) Prior Publication Data
US 2022/0146561 A1   May 12, 2022

(30) Foreign Application Priority Data
Nov. 18, 2019  (KR) .................. 10-2019-0147977

(51) Int. Cl.
*G01R 27/02* (2006.01)
*G01R 31/382* (2019.01)
*H01M 10/48* (2006.01)

(52) U.S. Cl.
CPC ......... *G01R 27/025* (2013.01); *G01R 31/382* (2019.01); *H01M 10/48* (2013.01)

(58) Field of Classification Search
CPC .... G01R 27/025; G01R 31/382; G01R 31/52; H01M 10/48; H02H 3/16; H02H 1/0007
(Continued)

(56) References Cited

U.S. PATENT DOCUMENTS

2013/0300430 A1   11/2013 Lindsay et al.
2013/0314097 A1   11/2013 Hausberger et al.
(Continued)

FOREIGN PATENT DOCUMENTS

CN   103048545 A   4/2013
CN   103576044 A   2/2014
(Continued)

OTHER PUBLICATIONS

Extended European Search Report including Written Opinion for Application No. 20889304.0 dated May 3, 2022, pp. 1-8.
(Continued)

*Primary Examiner* — Lee E Rodak
*Assistant Examiner* — Trung Q Nguyen
(74) *Attorney, Agent, or Firm* — Lerner David LLP (57) ABSTRACT

An apparatus and battery system for estimating insulation resistance including an insulation resistance measurement circuit connected to a first electrode of a battery, a first switch connected to the first resistor, a second resistor connected to the first switch, a third resistor connected to the second resistor and a second electrode of the battery, and a second switch connected between a first contact point between the first switch and the second resistor and a chassis ground, a voltage measurement part measuring a voltage of a second contact point between the second resistor and the third resistor, and a controller controlling the first and second switches and calculating an insulation resistance value based on the voltage measured at the second contact point the first and second switches are ON, and the voltage measured at the second contact point while the first switch is OFF and the second switch is ON.

12 Claims, 9 Drawing Sheets

(58) Field of Classification Search
USPC .................................. 324/500, 551, 425–434
See application file for complete search history.

(56) References Cited

U.S. PATENT DOCUMENTS

| | | |
|---|---|---|
| 2014/0021961 A1 | 1/2014 | Yamada et al. |
| 2014/0095093 A1 | 4/2014 | Hong et al. |
| 2014/0152224 A1* | 6/2014 | Enomoto ............... G01R 31/40 318/490 |
| 2014/0159908 A1* | 6/2014 | Hong .................... G01R 31/52 702/58 |
| 2015/0293167 A1 | 10/2015 | Kawamura |
| 2016/0252555 A1 | 9/2016 | Deumal Herraiz et al. |
| 2017/0176512 A1 | 6/2017 | Pritelli et al. |
| 2018/0222342 A1 | 8/2018 | Comesana |
| 2019/0086464 A1 | 3/2019 | Kawamura |
| 2020/0088803 A1 | 3/2020 | Park et al. |

FOREIGN PATENT DOCUMENTS

| | | |
|---|---|---|
| CN | 104220887 A | 12/2014 |
| CN | 104977511 A | 10/2015 |
| CN | 105277787 A | 1/2016 |
| CN | 206038771 U | 3/2017 |
| CN | 106896274 A | 6/2017 |
| CN | 108398598 A | 8/2018 |
| CN | 108872812 A | 11/2018 |
| CN | 109997047 A | 7/2019 |
| DE | 102013215731 A1 | 2/2015 |
| DE | 102016201655 A1 | 9/2016 |
| EP | 3361271 A1 | 8/2018 |
| JP | H01-165973 A | 6/1989 |
| JP | 2006220520 A | 8/2006 |
| JP | 2012-173053 A | 9/2012 |
| JP | 2015-509605 A | 3/2015 |
| JP | 2015-518141 A | 6/2015 |
| KR | 20130110066 A | 10/2013 |
| KR | 20130128597 A | 11/2013 |
| KR | 20140041213 A | 4/2014 |
| KR | 101512395 B1 | 4/2015 |
| KR | 20150081988 A | 7/2015 |
| KR | 101619328 B1 | 5/2016 |
| KR | 20180051948 A | 5/2018 |
| KR | 101887442 B1 | 8/2018 |
| KR | 20190001330 A | 1/2019 |
| KR | 101984326 B1 | 9/2019 |

OTHER PUBLICATIONS

International Search Report for PCT/KR2020/013068 dated Jan. 7, 2021; 4 pages.

Wei, Y. et al., "An Active Detection Method for Insulation Performance of High Voltage Power Battery Pack" Computing Technology and Automation, China Academic Journal Electronic Publishing House, Sep. 2015, pp. 55-59, vol. 34, No. 3.

Guangmin, L. et al., "Research on Online Isolation Resistance Inspection Method for Power Battery of Electric Vehicle" Institute of Automation, Shandong Academy of Sciences, Nov. 2013, pp. 51-54.

* cited by examiner

APPARATUS FOR ESTIMATING INSULATION RESISTANCE AND BATTERY SYSTEM USING THE SAME

CROSS-REFERENCE WITH RELATED APPLICATION(S)

The present application is a national phase entry under 35 U.S.C. § 371 of International Application No. PCT/KR2020/013068, filed Sep. 25, 2020, published in Korean, which claims priority from Korean Patent Application No. 10-2019-0147977 filed in the Korean Intellectual Property Office on Nov. 18, 2019, which are incorporated herein by reference.

The present invention relates to an apparatus for estimating insulation resistance and a battery system using the same.

BACKGROUND

In a situation in which high capacity is required as in an electric vehicle, an energy storage system, and an uninterruptible power supply, a plurality of battery cells of a secondary battery may be connected to be used as a battery module, or a plurality of battery modules may be connected to be used as a battery pack.

In a case of using a battery at high voltage by connecting battery cells or modules, insulation resistance of a predetermined level or more should be maintained to prevent electric shock to a user and to prevent unnecessary discharge. For example, when a high-voltage battery is applied and used in a vehicle, the insulation resistance between positive and negative electrodes of a battery and a chassis of the vehicle should be measured, and the insulation resistance should be maintained at a predetermined level or more.

Since a conventional apparatus for estimating insulation resistance has a complex configuration, when the apparatus for estimating the insulation resistance is implemented as a printed circuit board (PCB), a volume thereof is increased, and a calculation is complicated, causing error occurrence and a calculation error.

SUMMARY

Technical Problem

The present invention provides an apparatus for estimating insulation resistance having a simple configuration of an insulation resistance estimation circuit, and a battery system using the same.

The present invention provides an apparatus for estimating insulation resistance that may calculate insulation resistance formed between each of positive and negative electrodes of a battery and a chassis ground, and a battery system using the same.

The present invention provides an apparatus for estimating insulation resistance that may calculate insulation resistance formed between an arbitrary electrode of a battery and a chassis ground, and a battery system using the same.

Technical Solution

An apparatus for estimating insulation resistance according to an embodiment of the present invention includes: an insulation resistance measurement circuit that includes a first resistor having a first end connected to a first electrode of a battery, a first switch having a first end connected to a second end of the first resistor, a second resistor having a first end connected to a second end of the first switch, a third resistor having a first end connected to a second end of the second resistor and a second end connected to a second electrode of the battery, and a second switch having a first end connected to a first contact point between the first switch and the second resistor and a second end connected to a chassis ground; a voltage sensor configured to measure a voltage of a second contact point between the second resistor and the third resistor; and a controller configured to: control respective states of the first switch and the second switch; and calculate the insulation resistance value based on (i) the voltage measured at the second contact point while the first switch and the second switch are in an ON state and (ii) the voltage measured at the second contact point while the first switch is in an OFF state and the second switch is in the ON state.

The controller may be configured to calculate a first insulation resistance formed between the first electrode of the battery and the chassis ground and a second insulation resistance formed between the second electrode of the battery and the chassis ground, and calculates a parallel resistance value of the first insulation resistance and the second insulation resistance to obtain the insulation resistance value.

The controller may be configured to diagnose whether the insulation resistance measurement circuit operates normally based on the voltage measured at the second contact point and a resistance ratio of the first, second and third resistors while the first switch is in the ON state and the second switch is in an OFF state.

The controller may be configured to electrically disconnect the insulation resistance measurement circuit by turning the first switch and the second switch to the OFF state.

The insulation resistance measurement circuit may further include a diagnosis resistor connected between the first electrode of the battery and the second end of the second switch.

The controller may be configured to diagnose normal operation of the second switch based on (i) the voltage measured at the second contact point when the second switch is switched between the OFF state and the ON state while the first switch is in the ON state, (ii) resistance values of the first, second and third resistors, and (iii) a resistance value of the diagnosis resistor.

A battery system including an apparatus for estimating insulation resistance according to another embodiment of the present invention includes: a battery including a plurality of battery cells that are connected in series; and an insulation resistance measurement circuit that includes a first resistor having a first end connected to a first electrode of a battery, a first switch having a first end connected to a second end of the first resistor, a second resistor having a first end connected to a second end of the first switch, a third resistor having a first end connected to a second end of the second resistor and a second end connected to a second electrode of the battery, and a second switch having a first end connected to a first contact point between the first switch and the second resistor and a second end connected to a chassis ground, wherein the insulation resistance measurement circuit is configured to measure a voltage of a second contact between the second resistor and the third resistor, wherein the apparatus for estimating the insulation resistance is configured to calculate an insulation resistance value, based on (i) the voltage measured at the second contact point while the first switch and the second switch are in an ON state and (ii) the voltage measured at the second contact point while the first switch is in an OFF state and the second switch is in the ON state.

The apparatus for estimating the insulation resistance may be configured to calculate a first insulation resistance formed between the first electrode of the battery and the chassis ground and a second insulation resistance formed between the second electrode of the battery and the chassis ground, and calculates a parallel resistance value of the first insulation resistance and the second insulation resistance to obtain the insulation resistance value.

The apparatus for estimating the insulation resistance may be configured to diagnose whether the apparatus for estimating the insulation resistance operates normally based on the voltage measured at the second contact point and a resistance ratio of the first, second and third resistors while the first switch is in the ON state and the second switch is in an OFF state.

The apparatus for estimating the insulation resistance may be configured to electrically disconnect the apparatus for estimating the insulation resistance by turning the first switch and the second switch to the OFF state.

The apparatus for estimating the insulation resistance may further include a diagnosis resistor connected between the first electrode of the battery and the second end of the second switch.

The apparatus for estimating the insulation resistance may be configured to diagnose normal operation of the second switch based on (i) the voltage measured at the second contact point when the second switch is switched between the OFF state and the ON state while the first switch is in the ON state, (ii) resistance values of the first, second and third resistors, and (iii) a resistance value of the diagnosis resistor.

Advantageous Effects

The present invention provides an effect of simplifying a circuit for estimating insulation resistance to reduce a volume and reduce a cost when designing a PCB of an apparatus for estimating insulation resistance.

BRIEF DESCRIPTION OF THE DRAWINGS

FIG. 3 illustrates a circuit diagram of an insulation resistance measurement circuit in a state in which first and second switches of FIG. 2 are turned on.

FIG. 4 illustrates a circuit diagram of an insulation resistance measurement circuit in a state in which a second switch of FIG. 2 is turned on.

FIG. 7 illustrates a circuit diagram of an insulation resistance measurement circuit in a state in which first and second switches of FIG. 6 are turned on.

FIG. 8 illustrates a circuit diagram of an insulation resistance measurement circuit in a state in which a first switch of FIG. 6 is turned off and a second switch thereof is turned on.

DETAILED DESCRIPTION

All constituent elements that are in a current path in a battery system are insulated from a chassis ground. In this case, a resistance component between all the constituent elements that are in the current path in the battery system and the chassis ground is referred to as insulation resistance. In the following embodiment, an insulation resistance formed between each of a positive electrode and a negative electrode of a battery and a chassis ground is assumed and described, or an insulation resistance formed between an arbitrary electrode of a battery and a chassis ground is assumed and described. However, an insulation resistance that may be formed in a battery system to which the present invention is applied is not limited to the above example.

Hereinafter, embodiments disclosed in the present specification will be described in detail with reference to the accompanying drawings, and in the present specification, the same or similar constituent elements will be denoted by the same or similar reference numerals, and a redundant description thereof will be omitted. The terms "module" and/or "unit, portion, or part" representing constituent element used in the following description are used only in order to make understanding of the specification easier, and thus, these terms do not have meanings or roles that distinguish them from each other by themselves. In addition, in describing exemplary embodiments of the present specification, when it is determined that a detailed description of the well-known art associated with the present invention may obscure the gist of the present invention, it will be omitted. Further, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or may be connected or coupled to the other constituent element with a further constituent element intervening therebetween. In contrast, it should be understood that, when it is described that an element is "directly coupled" or "directly connected" to another element, no element is present between the element and the other element.

In the present application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

Figure 1:
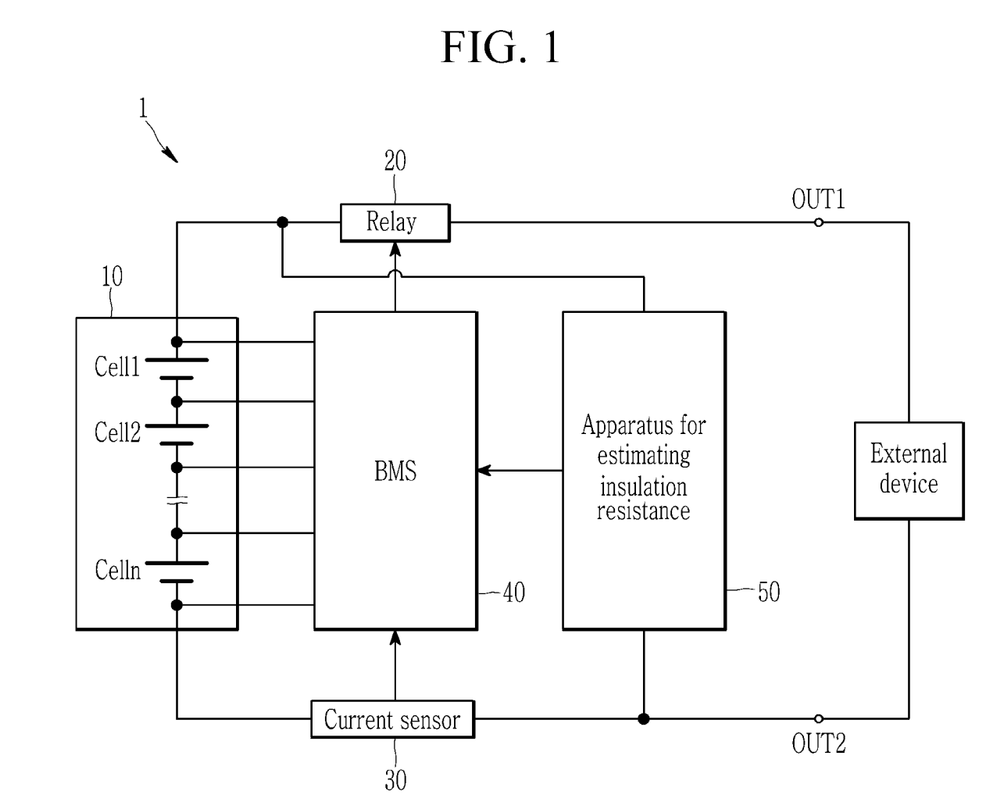
FIG. 1 illustrates a schematic view of a battery system according to an embodiment.

FIG. 1 is a drawing for illustrating a battery system according to an embodiment.

Referring to FIG. 1, a battery system 1 includes a battery 10, a relay 20, a current sensor 30, a battery management system (BMS) 40, and an apparatus 50 for estimating insulation resistance.

The battery 10 may supply necessary power by including a plurality of battery cells connected in series/in parallel. As shown in FIG. 1, the battery 10 includes a plurality of battery cells Cell1 to Celln connected in series, it is connected between two output terminals OUT1 and OUT2 of the battery system 1, the relay 20 is connected between a positive electrode of the battery 10 and the output terminal OUT1, and the current sensor 30 is connected between a negative electrode of the battery 10 and the output terminal OUT2.

The relay 20 controls electrical connection between the battery system 1 and an external device. When the relay 20 is turned on, the battery system 1 and the external devices are electrically connected such that charging or discharging is performed, and when relay 20 is turned off, the battery system 1 and the external devices are electrically separated.

The current sensor 30 is serially connected to a current path between the battery 10 and the external device. The current sensor 30 estimates a current flowing through the battery 10, that is, a charging current and a discharging current, and transmits an estimated result to the BMS 40.

The BMS 40 may monitor a voltage, a current, and a temperature of a cell of the battery 10 in real time, uniformly maintain a voltage between the plurality of battery cells Cell1 to Celln, and prevent excessive charging/discharging to optimally manage a state thereof. For example, The BMS 40 may diagnose stability related to the insulation resistance by receiving an insulation resistance estimation result from the apparatus 50 for estimating the insulation resistance. When the BMS 40 determines that there is a problem with the stability of the insulation resistance, it may generate a notification message.

The apparatus 50 for estimating the insulation resistance may measure insulation resistance formed between each of positive and negative electrodes of the battery 10 and a chassis ground, or measure insulation resistance formed between an arbitrary electrode of the battery 10 and the chassis ground. For example, since the apparatus 50 for estimating the insulation resistance is electrically connected to the battery system 1 when the insulation resistance is measured, and is electrically separated from the battery system 1 when the insulation resistance is not measured, it is possible to prevent unnecessary noise and leakage current from occurring.

Figure 2:
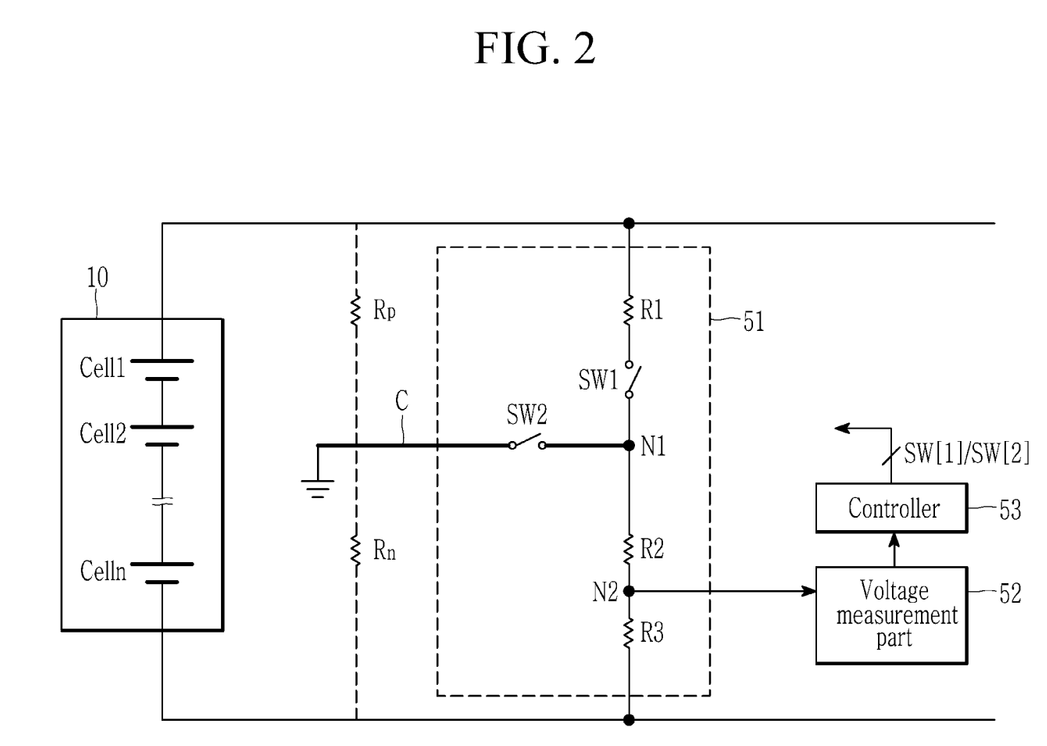
FIG. 2 illustrates a detailed schematic view of an apparatus for estimating insulation resistance formed between each of positive and negative electrodes of a battery and a chassis ground according to an embodiment.
Figure 3:
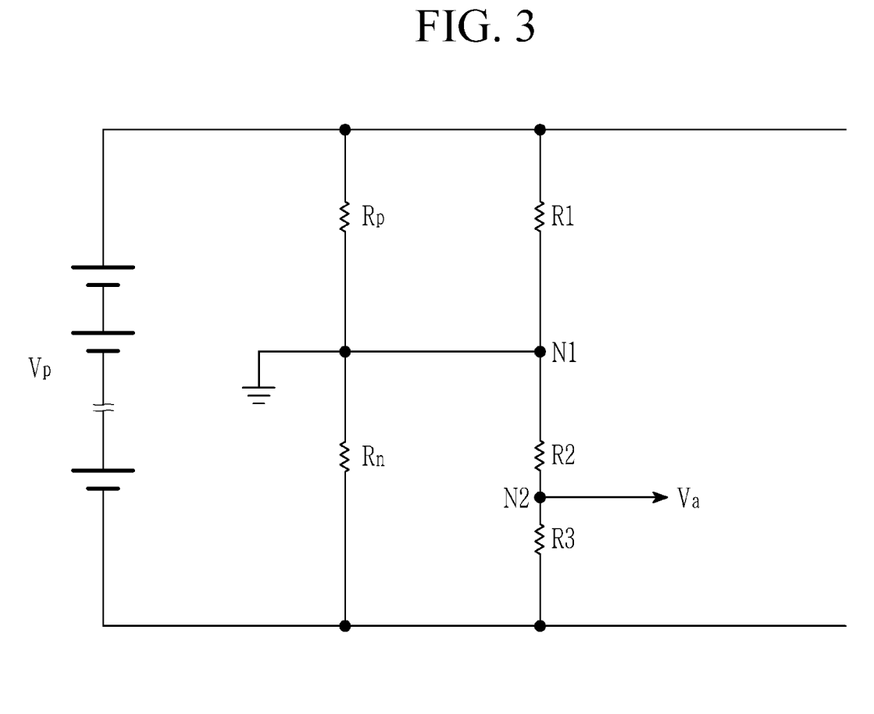
Figure 4:
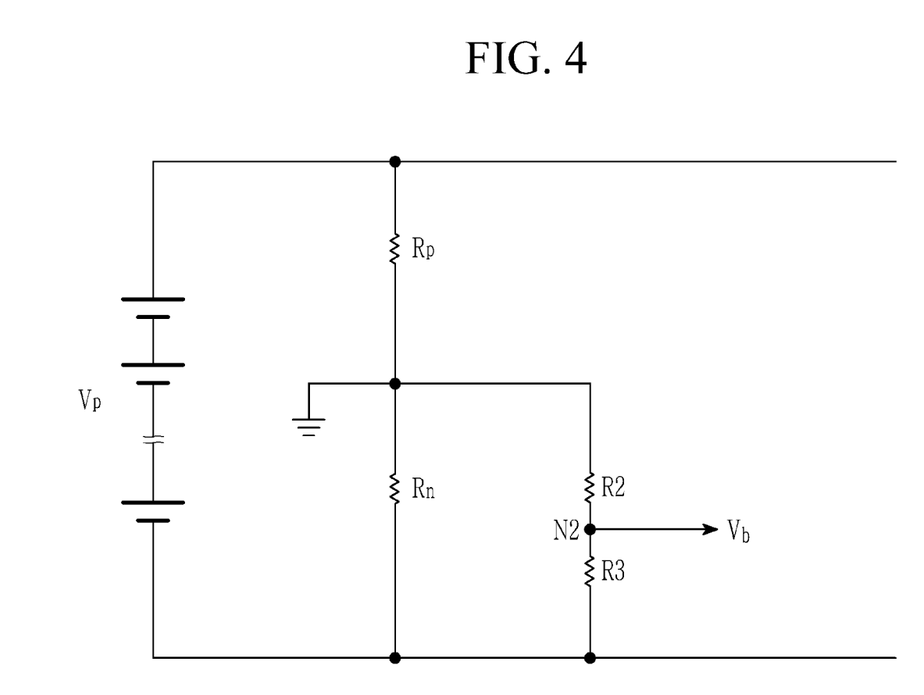
Figure 5:
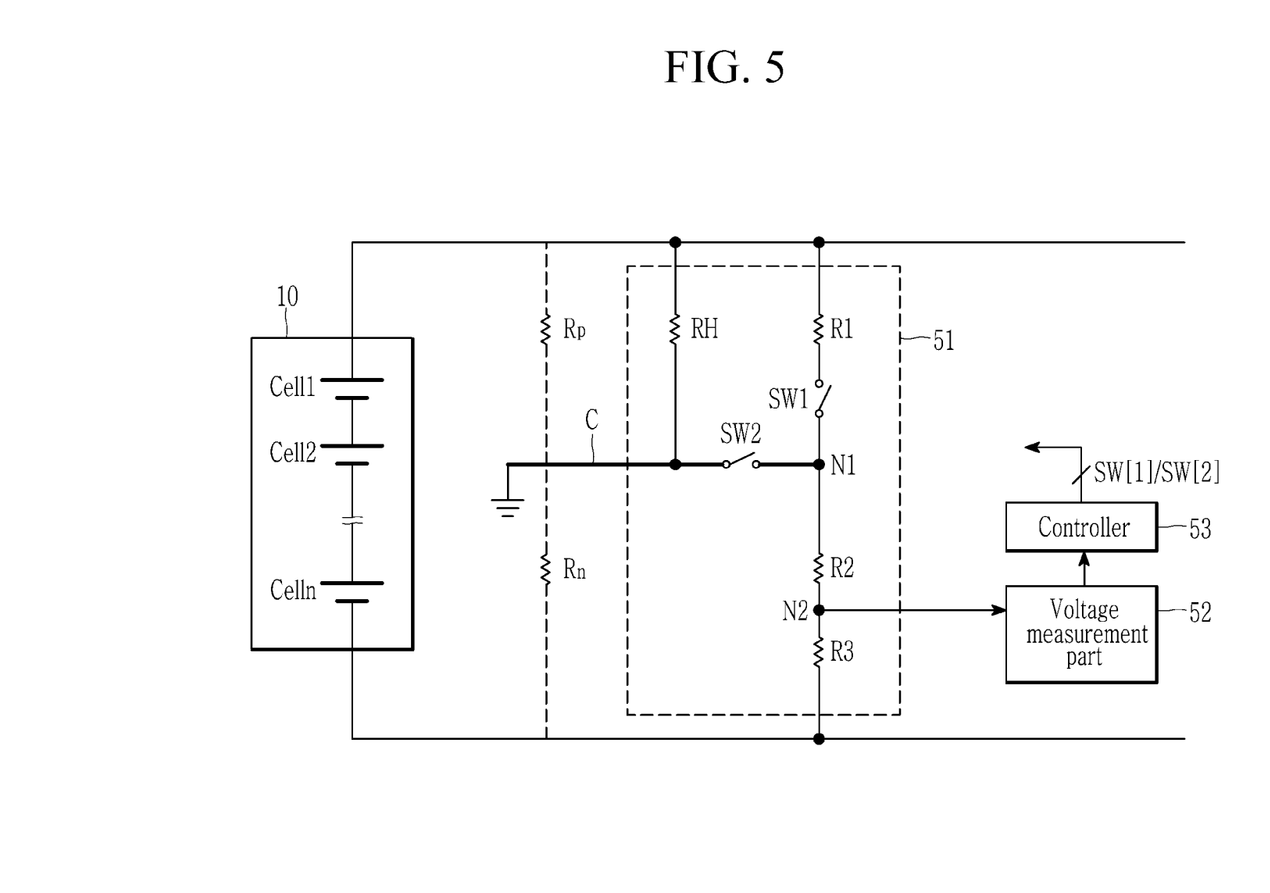
FIG. 5 illustrates a circuit diagram of an insulation resistance measurement circuit in which a diagnosis resistor is added to an apparatus for estimating insulation resistance of FIG. 2.

FIG. 2 illustrates a detailed schematic view of an apparatus for estimating insulation resistance formed between each of positive and negative electrodes of a battery and a chassis ground according to an embodiment, FIG. 3 illustrates a circuit diagram of an insulation resistance measurement circuit in a state in which first and second switches of FIG. 2 are turned on, FIG. 4 illustrates a circuit diagram of an insulation resistance measurement circuit in a state in which a second switch of FIG. 2 is turned on, and FIG. 5 illustrates a circuit diagram of an insulation resistance measurement circuit in which a diagnosis resistor is added to an apparatus for estimating insulation resistance of FIG. 2.

Referring to FIG. 2, the apparatus 50 for estimating the insulation resistance may include an insulation resistance measurement circuit 51, a voltage measurement part 52, and a controller 53. FIG. 1 illustrates that the apparatus 50 for estimating the insulation resistance is a separate configuration from the BMS 40, but the present invention is not limited thereto, and the apparatus 50 may be included in the BMS 40.

The insulation resistance measurement circuit 51 includes a first resistor R1 having one end connected to one electrode of the battery 10, a first switch SW1 having one end connected to the other end of the first resistor R1, a second resistor R2 having one end connected to the other end of the first switch SW1, a third resistor R3 having one end connected to the other end of the second resistor R2 and the other end connected to the other electrode of the battery 10, and a second switch SW2 having one end connected to a first contact N1 between the first switch SW1 and the second resistor R2 and the other end connected to a chassis C ground. A value of the first resistor R1 may correspond to a sum of values of the second resistor R2 and the third resistor R3.

A first insulation resistance Rp may be formed between the positive electrode of the battery 10 and the chassis C ground, and a second insulation resistance Rn may be formed between the negative electrode of the battery 10 and the chassis C ground. A value of an insulation resistance RL may be obtained by calculating a parallel (Rp∥Rn) resistance value of the first insulation resistance Rp and the second insulation resistance Rn.

The chassis C is a vehicle frame that forms a frame of a vehicle, and may mean a state in which a vehicle body is not mounted. The chassis C may be a form in which various constituent elements such as an engine, a transmission, a clutch, etc. are combined with a frame, which is a basic frame. In FIG. 2, the insulation resistance measurement circuit 51 is illustrated to be connected to the chassis C, but is not limited thereto, and may be combined with various devices.

The voltage measurement part 52 measures a voltage of a second contact N2 between the second resistance R2 and the third resistance R3 according to an on or off state of the first switch SW1 and the second switch SW2 to transmit it to the controller 53. The voltage of the second contact N2 is a voltage Vp of the battery 10 applied to the third resistor R3 according to the on or off state of the first switch SW1 and the second switch SW2.

The controller 53 controls switching of the first switch SW1 and the second switch SW2, and calculates the value of the insulation resistance RL based on a voltage measured at the second contact N2. The controller 53 may transmit the calculated value of the insulation resistance RL to the BMS 40.

Referring to FIG. 3, the controller 53 may derive the following Equation 1 based on a first voltage Va measured at the second contact N2 during an on period of the first switch SW1 and the second switch SW2.

$$V_a = \frac{(Rn \| R1) \times V_p}{(Pn \| R1) + (Rp \| R1)} \times \frac{R3}{R1} \qquad 식\ (1)$$

Referring to FIG. 4, the controller 53 may derive the following Equation 2 based on a second voltage Vb measured at the second contact N2 during an off period of the first switch SW1 and an on period of the second switch SW2.

$$V_b = \frac{(Rn \| R1) \times V_p}{(Pn \| R1) + (Rp)} \times \frac{R3}{R1} \qquad 식\ (2)$$

The controller 53 may derive the following Equation 3 by solving simultaneous equations of Equation 1 and Equation 2.

$$R_p = \left[\frac{(A-V_b) \times V_a}{(A-V_a) \times V_b} - 1\right] \times R1 \qquad 식\ (3)$$

$$Rn = \left[\frac{(A-V_b) \times V_a - (A-V_a) \times V_b}{(A-V_a) \times A - (A-V_b) \times V_a}\right] \times R1,$$

$$A = \frac{R3 \times V_p}{R1}$$

The controller 53 may calculate the first insulation resistance Rp and the second insulation resistance Rn by Equation 3, and then may calculate a parallel (Rp∥Rn) resistance value of the first insulation resistance Rp and the second insulation resistance Rn to obtain the value of the insulation resistance RL.

The controller 53 may diagnose whether the insulation resistance measurement circuit 51 is normally operating by using the second switch SW2. Specifically, when the first switch SW1 is turned on by the controller 53 and when the second switch SW2 is turned off by the controller 53, the insulation resistance measurement circuit 51 is electrically separated from the first insulation resistance Rp, the second insulation resistance Rn, and the chassis C ground, while it is electrically connected to the positive and negative electrodes of the battery 10. In this case, the controller 53 may diagnose whether the insulation resistance measurement circuit 51 is normally operating based on the voltage measured at the second contact N2 and based on a resistance ratio of the first to third resistors R1, R2, and R3.

Referring to FIG. 5, the insulation resistance measurement circuit 51 may further include a diagnosis resistor RH connected between one electrode of the battery 10 and the other end of the second switch SW2. The controller 53 may diagnose whether the second switch SW2 is normally turned on or off by using the diagnosis resistor RH. Specifically, based on the voltage respectively measured at the second contact point N2 when the second switch SW2 is turned on and the second switch SW2 is turned off by the control unit 53 in the on state of the first switch SW1, and based on the values of the first to third resistors R1, R2, and R3 and the diagnostic resistor RH, whether the second switch SW2 is normally operated on/off may be diagnosed.

Figure 6:
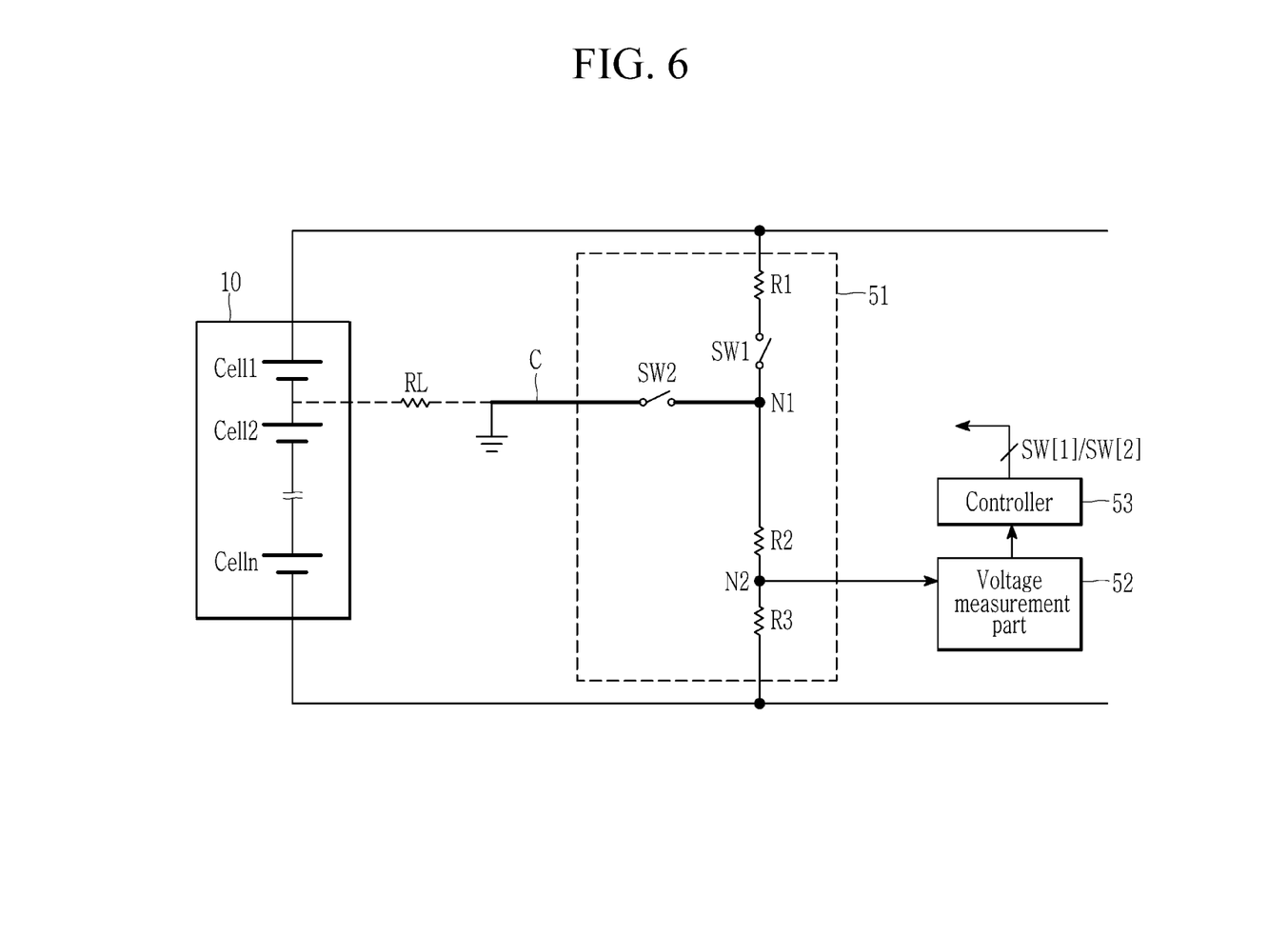
FIG. 6 illustrates a detailed schematic view of an apparatus for estimating insulation resistance formed between an arbitrary electrode of a battery module and a chassis ground according to an embodiment.
Figure 7:
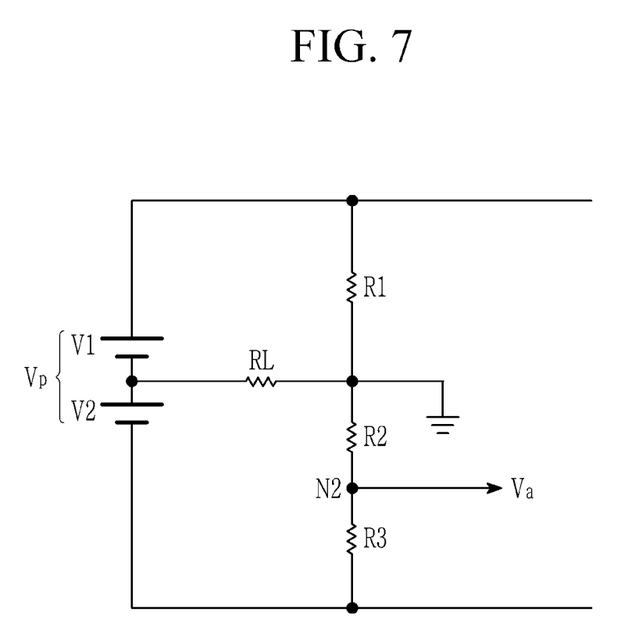
Figure 8:
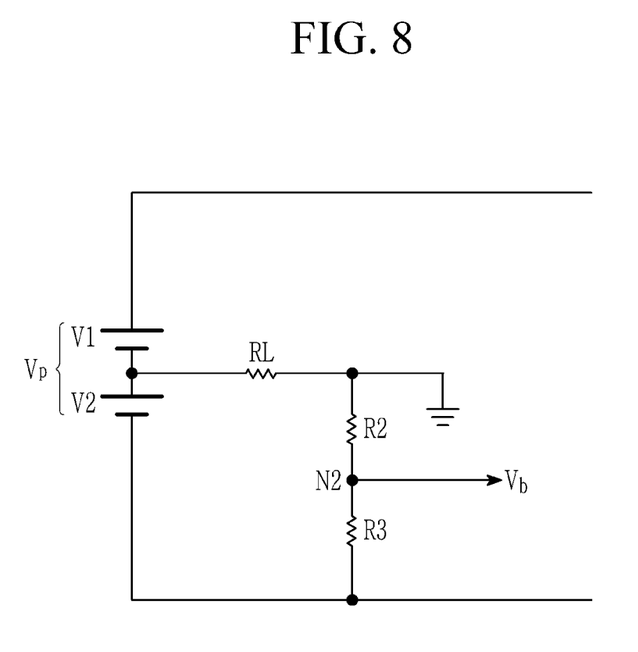
Figure 9:
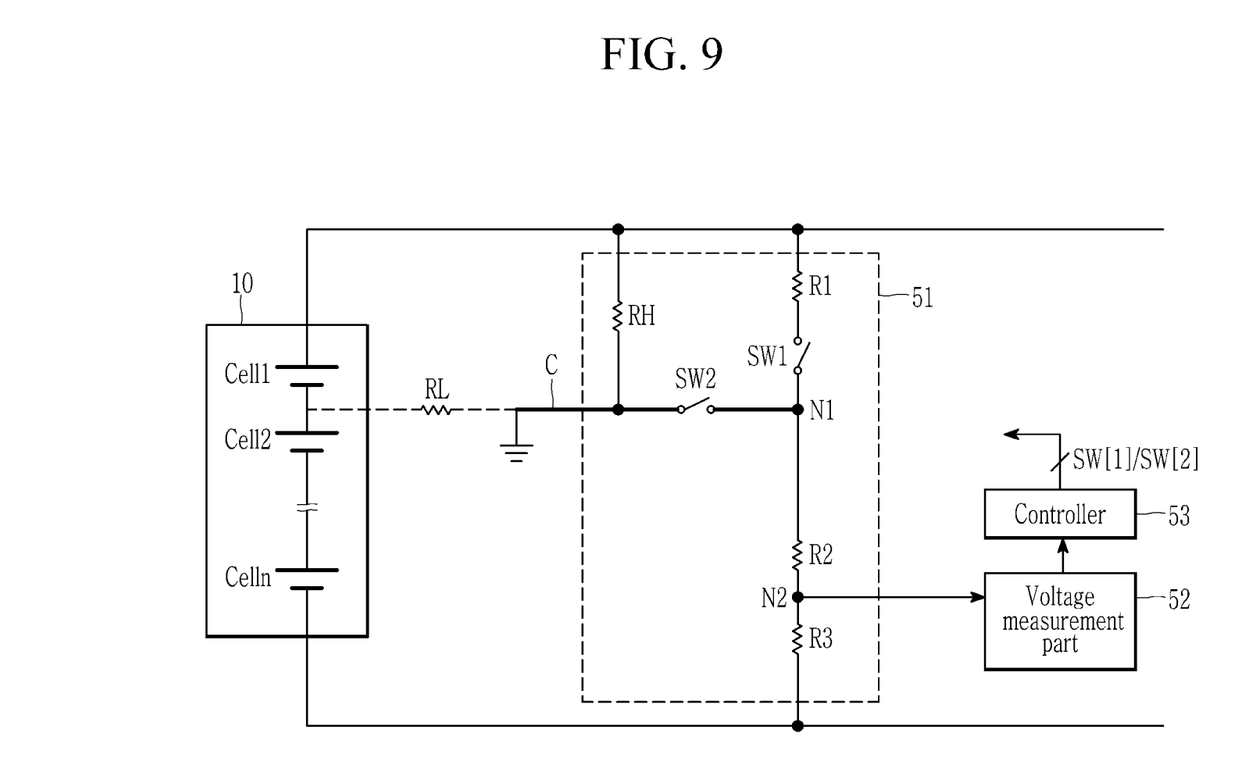
FIG. 9 illustrates a circuit diagram of an insulation resistance measurement circuit in which a diagnosis resistor is added to an apparatus for estimating insulation resistance of FIG. 6.

FIG. 6 illustrates a detailed schematic view of an apparatus for estimating insulation resistance formed between an arbitrary electrode of a battery module and a chassis ground according to an embodiment, FIG. 7 illustrates a circuit diagram of an insulation resistance measurement circuit in a state in which first and second switches of FIG. 6 are turned on, FIG. 8 illustrates a circuit diagram of an insulation resistance measurement circuit in a state in which a first switch of FIG. 6 is turned off and a second switch thereof is turned on, and FIG. 9 illustrates a circuit diagram of an insulation resistance measurement circuit in which a diagnosis resistor is added to an apparatus for estimating insulation resistance of FIG. 6.

Referring to FIG. 6, an apparatus 50 for estimating insulation resistance corresponds to the apparatus 50 for estimating the insulation resistance shown in FIG. 2. Constituent elements respectively included in the apparatuses 50 for estimating the insulation resistance shown in FIG. 2 and FIG. 6, arrangements of the constituent elements, and functions thereof are the same. Hereinafter, a description of the constituent elements of the apparatus 50 for estimating the insulation resistance illustrated in FIG. 6 will be replaced with the description of the constituent elements of the apparatus 50 for estimating the insulation resistance illustrated in FIG. 2.

The insulation resistance RL may be formed between an arbitrary electrode of the battery 10 and the chassis C ground. A sum of a voltage V1 between the positive electrode of battery 10 and a contact point connected to the insulation resistance RL and a voltage V2 between the contact point connected to the insulation resistance RL and the negative electrode of the battery 10 corresponds to a total voltage Vp of the battery 10.

Referring to FIG. 6 and FIG. 7, the controller 53 may derive the following Equation 4 based on the first voltage Va measured at the second contact N2 during the on period of the first switch SW1 and the second switch SW2.

$$V_a = \frac{(R3 \times R_L)}{(2R_L + R1)} \times \left(\frac{V_p}{R1} + \frac{V2}{R_L}\right) \qquad 식\ (4)$$

Referring to FIG. 6 and FIG. 8, the controller 53 may derive the following Equation 5 based on the second voltage Vb measured at the second contact N2 during the off period of the first switch SW1 and the on period of the second switch SW2.

$$V2 = (R_L + R1) \times \frac{V_b}{R3} \qquad 식\ (5)$$

The controller 53 may derive the following Equation 6 related to the insulation resistance RL by solving simultaneous equations of Equation 4 and Equation 5.

$$R_L = \frac{(V_a - V_b) \times R1}{V_b - 2V_a + R3 \times \frac{V_p}{R1}} \qquad 식\ (6)$$

When the insulation resistance Rp and the second insulation resistance Rn based on Equation 1 to Equation 3 are calculated, respectively, the value of the insulation resistance RL obtained by calculating the parallel (Rp∥Rn) resistance value of the first insulation resistance Rp and the second insulation resistance Rn and the value of the insulation resistance RL obtained based on Equation 4 to Equation 6 are the same.

The controller 53 may diagnose whether the insulation resistance measurement circuit 51 is normally operating by using the second switch SW2. Specifically, when the first switch SW1 is turned on by the controller 53 and when the second switch SW2 is turned off by the controller 53, the insulation resistance measurement circuit 51 is electrically separated from the first insulation resistance Rp, the second insulation resistance Rn, and the chassis C ground, while it is electrically connected to the positive and negative electrodes of the battery 10. In this case, the controller 53 may diagnose whether the insulation resistance measurement circuit 51 is normally operating based on the voltage measured at the second contact N2 and based on the resistance ratio of the first to third resistors R1, R2, and R3.

Referring to FIG. 9, the insulation resistance measurement circuit 51 may further include a diagnosis resistor RH connected between one electrode of the battery 10 and the other end of the second switch SW2. The controller 53 may diagnose whether the second switch SW2 is normally turned on or off by using the diagnosis resistor RH. Specifically, based on the voltage respectively measured at the second contact point N2 when the second switch SW2 is turned on and the second switch SW2 is turned off by the control unit 53 in the on state of the first switch SW1, and based on the values of the first to third resistors R1, R2, and R3 and the diagnostic resistor RH, whether the second switch SW2 is normally operated on/off may be diagnosed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

1: battery system
10: battery
20: relay
30: current sensor
40: BMS
50: apparatus for estimating insulation resistance

The invention claimed is:

1. An apparatus for estimating insulation resistance, comprising:
   an insulation resistance measurement circuit that includes a first resistor, a first switch, a second resistor, a third resistor, and a second switch, wherein the first resistor is between a first electrode of a battery and the first switch, the first switch is between the first resistor and the second resistor, the second resistor is between the first switch and the third resistor, the third resistor is between the second resistor and the second electrode of the battery, and the second switch is between a first contact point and a chassis ground and is configured to direct electrical current from the battery towards the chassis ground and away from the second resistor when the second switch is in an ON state, wherein the first contact point is between the first switch and the second resistor;
   a voltage sensor configured to measure a voltage of a second contact point between the second resistor and the third resistor; and
   a controller configured to:
      control respective states of the first switch and the second switch; and
      calculate the insulation resistance value based on (i) the voltage measured at the second contact point while the first switch and the second switch are in the ON state and (ii) the voltage measured at the second contact point while the first switch is in an OFF state and the second switch is in the ON state.

2. The apparatus for estimating the insulation resistance of claim 1, wherein
   the controller is configured to diagnose whether the insulation resistance measurement circuit operates normally based on the voltage measured at the second contact point and a resistance ratio of the first, second and third resistors while the first switch is in the ON state and the second switch is in an OFF state.

3. The apparatus for estimating the insulation resistance of claim 1, wherein
   the controller is configured to electrically disconnect the insulation resistance measurement circuit by turning the first switch and the second switch to the OFF state.

4. The apparatus for estimating the insulation resistance of claim 1, wherein
   the insulation resistance measurement circuit further includes a diagnosis resistor connected between the first electrode of the battery and the second end of the second switch.

5. The apparatus for estimating the insulation resistance of claim 4, wherein
   the controller is configured to diagnose normal operation of the second switch based on (i) the voltage measured at the second contact point when the second switch is switched between the OFF state and the ON state while the first switch is in the ON state, (ii) resistance values of the first, second and third resistors, and (iii) a resistance value of the diagnosis resistor.

6. The apparatus for estimating the insulation resistance of claim 1, wherein,
   the controller is configured to calculate a first insulation resistance formed between the first electrode of the battery and the chassis ground and a second insulation resistance formed between the second electrode of the battery and the chassis ground, and calculates a parallel resistance value of the first insulation resistance and the second insulation resistance to obtain the insulation resistance value.

7. A battery system including an apparatus for estimating insulation resistance, comprising:
   a battery including a plurality of battery cells that are connected in series; and
   an insulation resistance measurement circuit that includes a first resistor, a first switch, a second resistor, a third resistor, and a second switch, wherein the first resistor is between a first electrode of a battery and the first switch, the first switch is between the first resistor and the second resistor, the second resistor is between the first switch and the third resistor, the third resistor is between the second resistor and the second electrode of the battery, and the second switch is between a first contact point and a chassis ground and is configured to direct electrical current from the battery towards the chassis ground and away from the second resistor when the second switch is in an ON state, wherein the first contact point is between the first switch and the second resistor, and wherein the insulation resistance measurement circuit is configured to measure a voltage of a second contact between the second resistor and the third resistor,
   wherein the apparatus for estimating the insulation resistance is configured to calculate an insulation resistance value, based on (i) the voltage measured at the second contact point while the first switch and the second switch are in the ON state and (ii) the voltage measured at the second contact point while the first switch is in an OFF state and the second switch is in the ON state.

8. The battery system of claim 7, wherein
   the apparatus for estimating the insulation resistance is configured to diagnose whether the apparatus for estimating the insulation resistance operates normally based on the voltage measured at the second contact point and a resistance ratio of the first, second and third resistors while the first switch is in the ON state and the second switch is in an OFF state.

9. The battery system of claim 7, wherein the apparatus for estimating the insulation resistance is configured to electrically disconnect the apparatus for estimating the insulation resistance by turning the first switch and the second switch to the OFF state.

10. The battery system of claim 7, wherein the apparatus for estimating the insulation resistance further includes a diagnosis resistor connected between the first electrode of the battery and the second end of the second switch.

11. The battery system of claim 10, wherein the apparatus for estimating the insulation resistance is configured to diagnose normal operation of the second switch based on (i) the voltage measured at the second contact point when the second switch is switched between the OFF state and the ON state while the first switch is in the ON state, (ii) resistance values of the first, second and third resistors, and (iii) a resistance value of the diagnosis resistor.

12. The battery system of claim 7, wherein, the apparatus for estimating the insulation resistance is configured to calculate a first insulation resistance formed between the first electrode of the battery and the chassis ground and a second insulation resistance formed between the second electrode of the battery and the chassis ground, and calculates a parallel resistance value of the first insulation resistance and the second insulation resistance to obtain the insulation resistance value.

\* \* \* \* \*